(12) United States Patent
Feng et al.

(10) Patent No.: US 7,839,163 B2
(45) Date of Patent: Nov. 23, 2010

(54) PROGRAMMABLE THROUGH SILICON VIA

(75) Inventors: Kai Di Feng, Hopewell Junction, NY (US); Louis Lu-Chen Hsu, Fishkill, NY (US); Ping-Chuan Wang, Hopewell Junction, NY (US); Zhijian Yang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/357,659

(22) Filed: Jan. 22, 2009

(65) Prior Publication Data

US 2010/0182040 A1    Jul. 22, 2010

(51) Int. Cl.
*H03K 19/173* (2006.01)
(52) U.S. Cl. .......................................... 326/38; 326/41
(58) Field of Classification Search ............. 326/37–41
See application file for complete search history.

(56) References Cited

U.S. PATENT DOCUMENTS

| | | | |
|---|---|---|---|
| 5,965,270 A | 10/1999 | Fang et al. | |
| 6,400,008 B1 * | 6/2002 | Farnworth | 257/698 |
| 6,979,880 B2 * | 12/2005 | Bhattacharyya et al. | 257/530 |
| 7,317,256 B2 | 1/2008 | Williams et al. | |
| 7,402,463 B2 | 7/2008 | Yang et al. | |
| 2008/0073747 A1 | 3/2008 | Chao et al. | |
| 2008/0079121 A1 | 4/2008 | Han | |

* cited by examiner

*Primary Examiner*—Don P Le
(74) *Attorney, Agent, or Firm*—Lisa U Jaklitsch; John A. Jordan; Katherine S. Brown

(57) ABSTRACT

Through silicon vias (TSVs) in silicon chips are both programmable and non-programmable. The programmable TSVs may employ metal/insulator/metal structures to switch from an open to shorted condition with programming carried out by complementary circuitry on two adjacent chips in a multi-story chip stack.

8 Claims, 17 Drawing Sheets

MIM ANTI-FUSE ELEMENT

PROGRAMMABLE THROUGH SILICON VIA

BACKGROUND OF THE INVENTION

1. Field of the Invention

The present invention relates to programmable through silicon vias (TSV) and, more particularly, to programmable through silicon via structures used to carry electrical signals vertically through semiconductor die.

2. Background and Related Art

In the packaging of electronic devices, such as, semiconductor chips and wafers, or semiconductor chip carriers, vertical interconnection to the next packaging level, whether it be to a chip carrier or stacked chip, may be achieved by through silicon vias (TSVs). Various techniques are known to create TSVs. Stacking chips is a multi-story chip structure, sometimes referred to as a 3D chip stack, allows for reduced signal transmission distance from die to die and enables a large increase in the number of links that may be established between dies.

Such small-sized packages, as provided by 3D chip stacks using TSV structures, are in high demand for a variety applications, such as, cell phone, digital cameras, PDAs, GPSs, laptop computers, and the like. The continuation growth of these applications requires on-going efforts to boost performance, broaden functionalities, reduce cost and increase packaging densities.

One of the difficulties with such structures is that when the 3D stack is assembled, the interconnects between chips are formed by prefabricated TSVs. As a result, it is not possible to alter the status of these TSVs, once assembled. However, for purposes of repairing, programming, altering status and rerouting, it is desirable to have the capability to open an originally shorted TSV line, or to short an originally opened TSV link between two, adjacent, chips.

SUMMARY OF THE PRESENT INVENTION

In accordance with embodiments of the present invention, methods and apparatus act to provide a programmable arrangement that allows an originally opened TSV link between chips, for example, to be closed through program control circuitry.

Embodiments of the invention are generally directed to a programmable TSV for a chip arrangement. Stacked chips with programmable TSVs may be employed, and further arrangements are also provided wherein the programmable TSVs may be programmed through control circuitry, as may exist in adjacent chips, for example, cooperatively acting together to close TSVs in the chips. A chip may include both programmable and permanent, i.e. non-programmable TSVs, and programmable TSVs may include both anti-fuse and fuse structures for creating shorted and opened TSVs.

In an embodiment of the invention, an electronic package includes at least one chip having at least one programmable through silicon via for chip interconnection to other electronic structure.

In other aspects of the electronic package;

the at least one through silicon via is a metal/insulator/metal anti-fuse layered structure;

the metal/insulator/metal anti-fuse layered structure is formed in the via of the at least one through silicon via;

the metal/insulator/metal anti-fuse layered structure is programmed from a high impedance state to a low impedance state by controlling the voltage level across the opposing metal sides of said layered structure using control circuitry in each of at least two chips stacked one on another;

during programming operation, functional circuits in each of the at least two chips are decoupled by isolation circuits from the control circuitry during programming;

during programming operation, the control circuitry in one of the at least two chips controls the voltage level applied to one of the metal sides of the anti-fuse structure and senses when the anti-fuse structure goes from the high impedance state to the low impedance state; and during programming operation, the control circuitry in the other of the at least two chips controls the voltage level on the other of the metal sides of said anti-fuse structure.

In another embodiment, an electronic package is provided including a plurality of stacked chips interconnected by through silicon vias at least some of which are programmable by anti-fuse structure that provides high impedance value in an unprogrammed state and low impedance value in a programmed state in response to bias voltage applied through programming control circuitry arranged across two adjacent chips.

In yet another embodiment, a method is provided for programming a through silicon via interconnecting chips in a chip stack by applying a first potential to one end of said programmable through silicon via, applying a second potential different from the first potential to another end of the programmable through silicon via, sensing when the programmable through silicon via is programmed, and removing the first potential and the second potential from the programmable through silicon via.

In other aspects of the method for programming a through silicon via:

the step of applying a first potential to one end of the programmable through silicon via is applied through one chip of the chip stack and the step of applying a second potential to another end of said programmable through silicon via is applied through another chip of said chip stack adjacent the one chip; and the further step of isolating functional circuits in the at least one chip and another chip from the steps of applying first potential and second potential during programming of said programmable through silicon via.

In a further embodiment, a method of making programmable through silicon vias in chips is provided by forming devices and circuits on a chip including control circuitry for programming at least one through silicon via in the chip, forming metallization and dielectric interconnecting the devices and circuits including metallization interconnecting the control circuitry for programming the at least one through silicon via, forming conductive through silicon vias in the chip for interconnecting the chip to other electronic apparatus, forming programmable material within the via of at least one of the conductive through silicon vias to form a programmable through silicon via, and forming a conductive connection between the programmable material and the control circuitry for programming said programmable through silicon via.

Further aspects of the method of making programmable through silicon vias in chips include:

the control circuitry is complementary to additional control circuitry in another chip used to control programming;

the additional control circuitry in the another chip is formed within devices and circuits of the another chip;

an electrical connection is formed from the additional control circuitry in the another chip to a surface contact pad is the layer of metallurgy of the another chip;

the control circuitry in the chip and another chip includes circuitry for isolating functional chip circuitry from programming control circuitry; and at least the chip and another chip are stacked one on another so that the surface contact pad of the another chip is electrically connected to the programmable through silicon via of the chip.

DETAILED DESCRIPTION OF THE DRAWINGS

Figure 1:
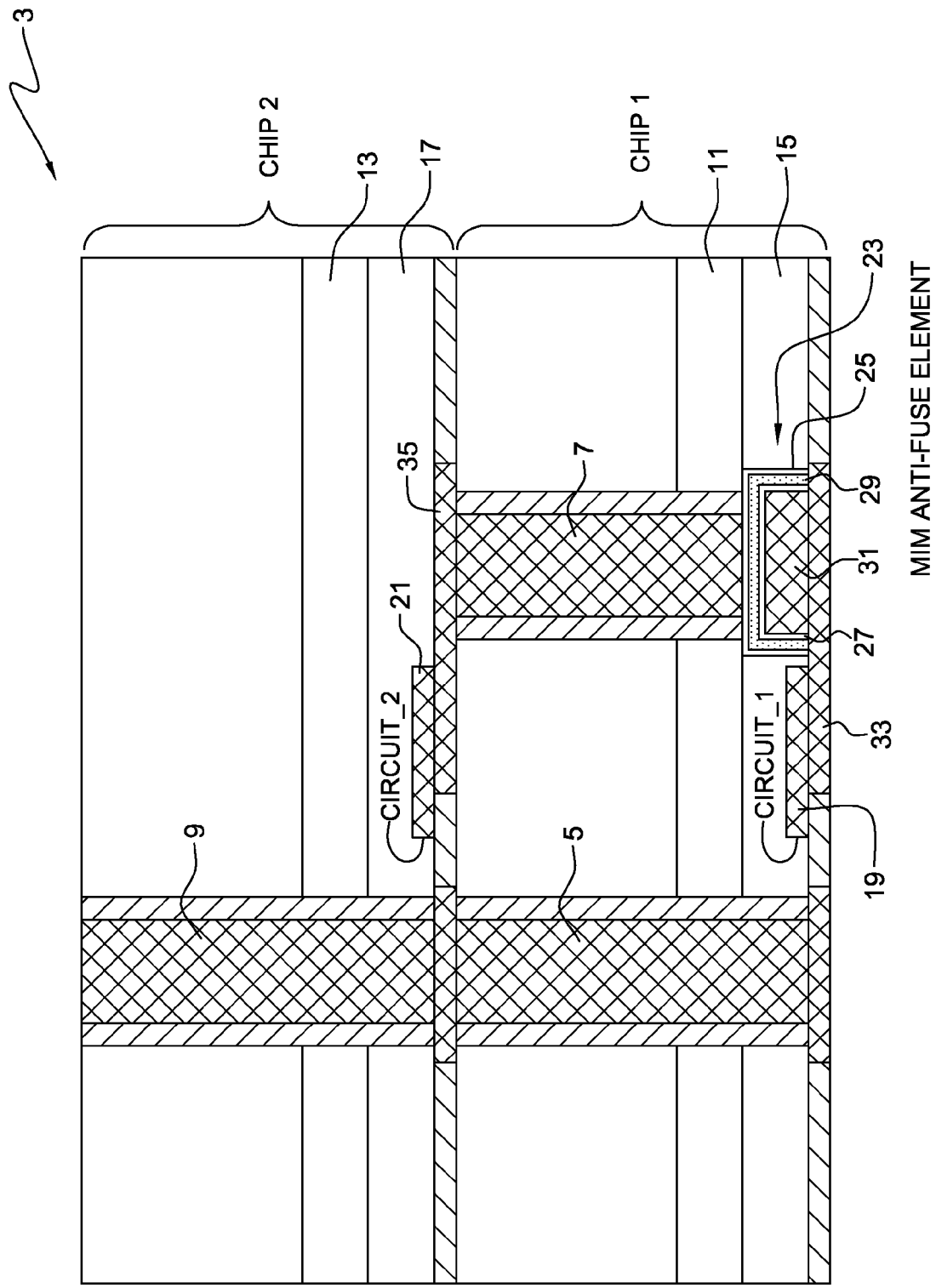
FIG. 1 shows a pair of stacked chips, one of which includes a programmable TSV structure.

With reference to FIG. 1, there is shown an embodiment of a stacked chip structure 3. Although two chips are shown, it is clear that more than two chips may be stacked in the chip stack. Both chips 1 and 2 include through silicon vias (TSVs) with chip 1 having a non-programmable, i.e. conventional, via 5 and programmable via 7. Chip 2 includes on a non-programmable via 9. It is clear that although the vias are designated through "silicon" vias, the vias may just as well exist in material other than silicon. It is also clear that additional TSVs may be included in the chips.

In general, such chips may be fabricated at the wafer level with standard devices and circuits formed in layers 11 and 13, respectively, of chips 1 and 2 using front end of line (FEOL) processes. Interconnects and dielectrics may then be formed in layers 15 and 17, respectively, of chips 1 and 2 using back end of line (BEOL) processes. Included in layers 15 and 17 are metal contacts 19 and 21 which connect to program control circuitry, designated circuit 1 and circuit 2 in the respective chips 1 and 2. For convenience, contacts 19 and 21 are only shown as a portion of the circuits including devices, as formed in the FEOL layers 11 and 13 but not shown here. This programming control circuitry may be formed during BEOL processes and, as will be explained hereinafter, may be complementary in that one portion of the programming control circuitry is in circuit 1 and another portion of the programming control circuitry is in circuit 2. The programming control circuitry is designed to control the programming of programmable TSV 7 by causing anti-fuse structure 23 to go from a high impedance or open state to a low impedance or closed state. The programming control circuitry would typically be separate from the functional circuitry, i.e., the circuitry designed for chip operations, such as, logic, memory and the like.

Anti-fuse structure 23 may be any of a variety of anti-fuse structures. Among anti-fuse structures that may be employed are those involving a variety of metal/insulator/metal (MIM) arrangements. One such anti-fuse structure that may be employed is a MIM structure including an intermediate layered structure of 50-100 Å of SiC:H, 1000-2000 Å of Si:H and 50-100 Å of SiC:H between metal layers of any one of Al, Cu or W, for example.

Thus, as shown in FIG. 1, layers 25 and 27 may be SiC:H with layer 29 being Si:H. Via 7 and contact 31 within the trench may be any one of Al, Cu or W, for example. Although the metal contact 31 within the trench and the surface metal contact 33 are shown as two layers, they may be the same metal materials or different materials. Similarly, metal contact material 21 and 35 may be the same metal material or different materials. All of the TSVs are preferably made of the same material such as Al, Cu or W, for example. However, other metals may be used.

Figure 2:
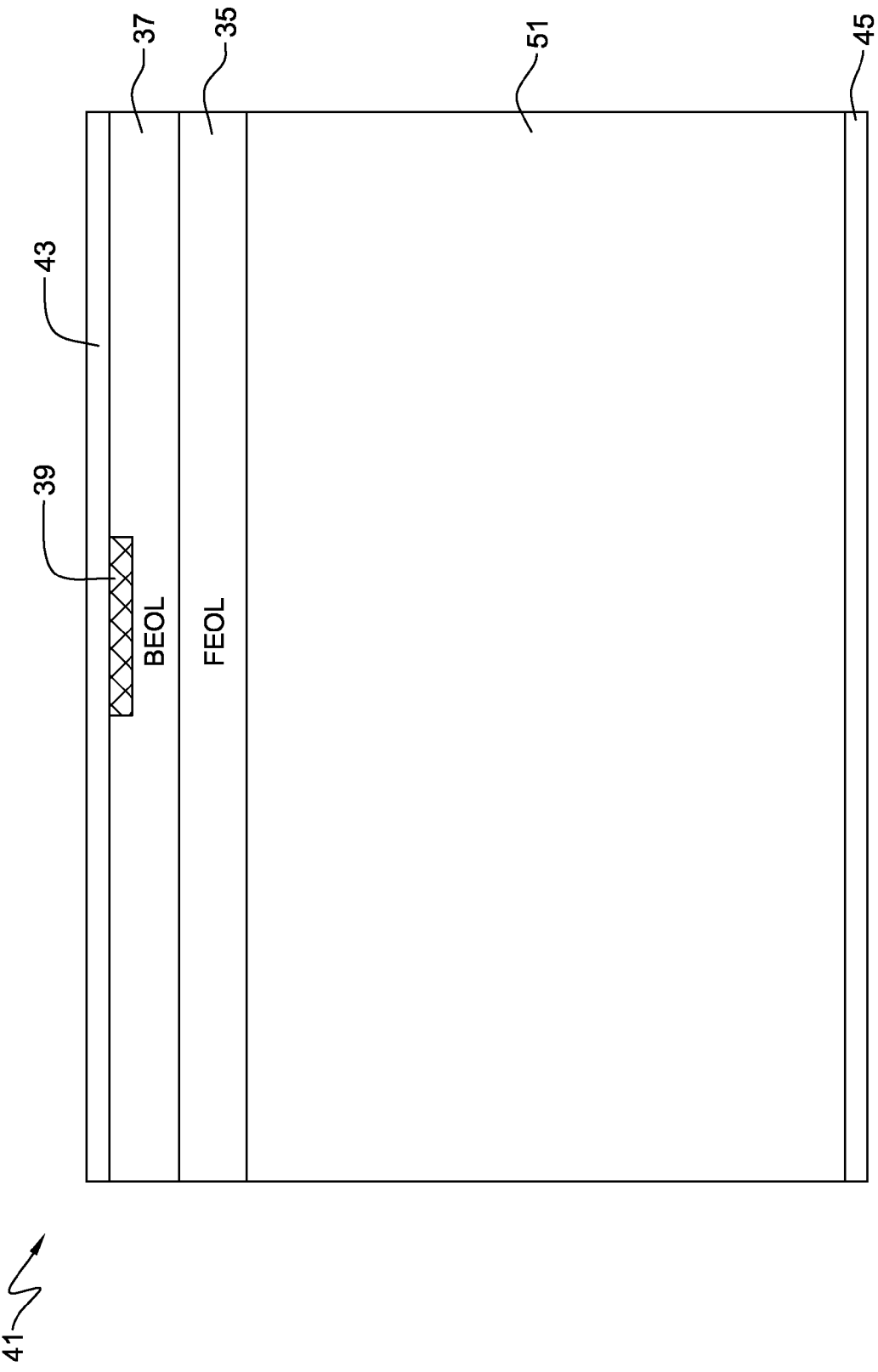
FIG. 2 shows a chip with a first layer including device and circuitry formed by front end of the line processing and a second layer including metallization formed at back end of the line processing.

With reference to FIG. 2, there is shown a chip structure 41 fabricated with layer 35 on silicon layer 51. Layer 35 includes device and circuit structures, as fabricated by any of a variety of FEOL processes. Layer 37, formed on layer 35, includes the metal interconnects and dielectric layers fabricated by any of a variety of BEOL processes.

In addition to the functional circuitry formed for chip performance, programming and sensing circuitry, as well as power sources, may also be fabricated in layer 35 for controlling the programming of the programmable TSVs. Interconnects for this control circuitry are, similarly, formed in layer 37 with metal contact 39 connected to the programming control circuitry of this chip. Upper protective layer 43 and lower protective layer 45 are formed on the chip structure.

Although description is made herein of fabricating at the chip level, it is understood that the processes employed to make the various chip structures may be carried out at the wafer level. Typically, the wafer would be diced into chips after wafer thinning, as described, for example, with reference to FIG. 12.

Figure 3:
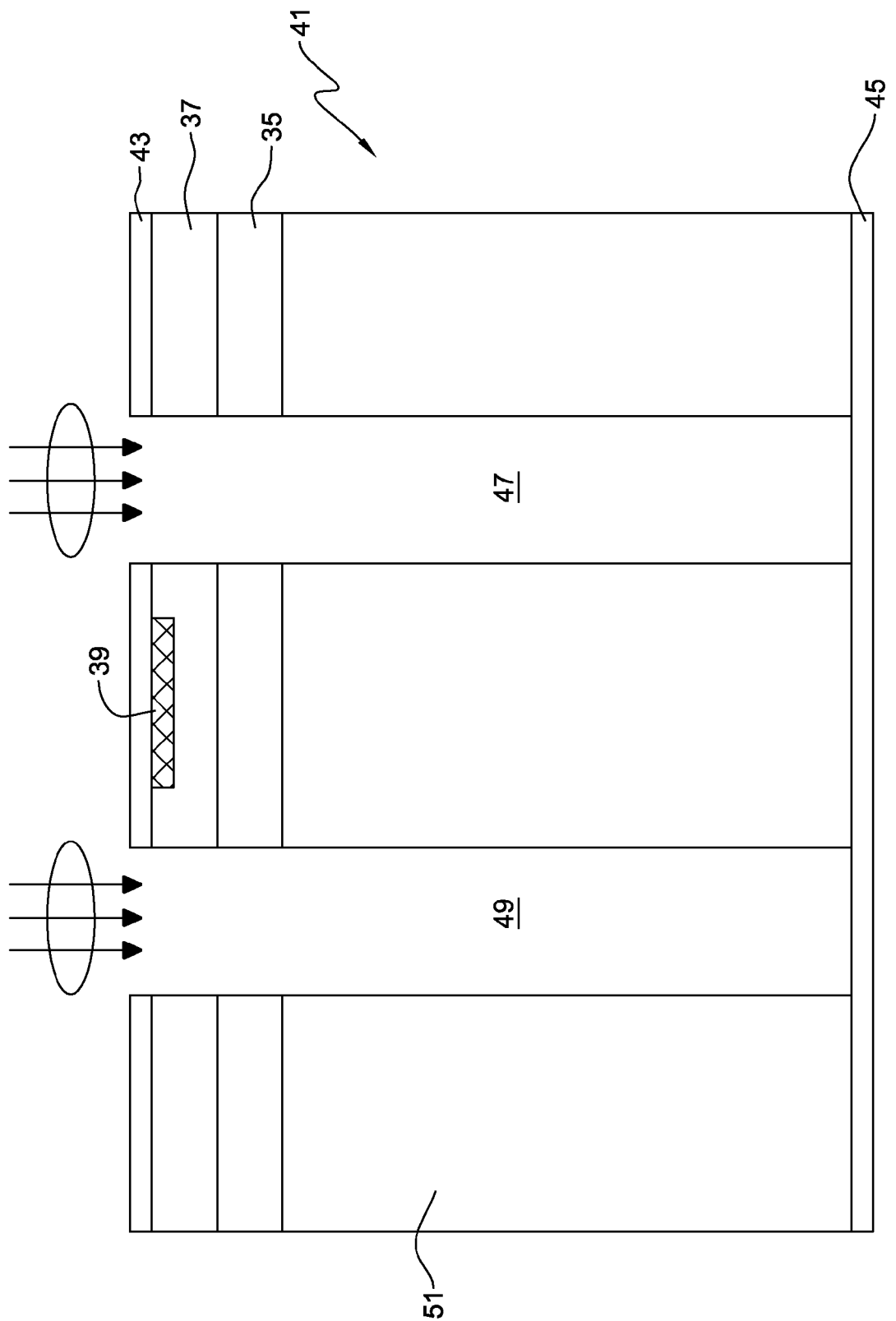
FIG. 3 shows a via formed in the chip of FIG. 2.

Protective layers 43 and 45 may be any of a variety of protective materials, such as, oxide or nitride layer or both, formed by conventional deposition processes. With reference to FIG. 3, a photoresist mask (not shown), for example, is then used to allow TSV 47 and 49 openings to be etched in upper protective layer 43, BEOL layer 37, FEOL layer 35 and silicon layer 51.

TSVs 47 and 49 openings may be round shape, for example, and 1 to 100 μm in diameter and 20 to 200 μm in depth. A deep reactive ion etch (RIE) method, for example, may be used here to form TSV 47 and 49 openings. Thus, deep silicon etching by fluorine radicals generated in a plasma, as is known in the art, may be employed. As shown in FIG. 3, etching is terminated at protective layer 45 which acts as an etch stop. However, it is clear that etching may be terminated at other selected points in silicon layer 51 and, as will be explained later, backside grinding of the silicon body used to reveal TSVs 47 and 49.

Figure 4:
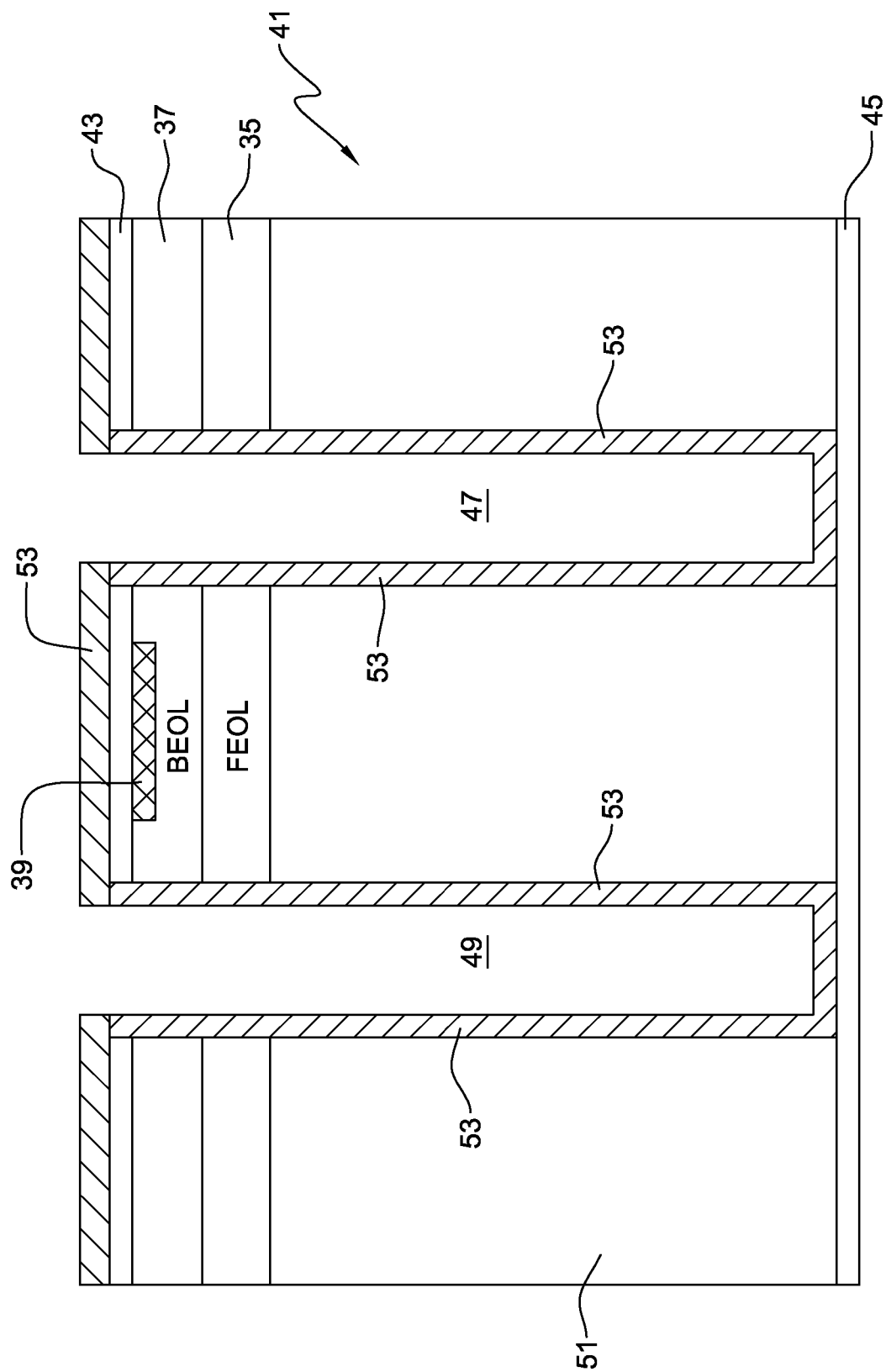
FIG. 4 shows the chip structure of FIG. 3 with a conformal layer of insulating material.

After forming the TSV 47 and 49 openings, a conformal layer 53 of insulating material is deposited on chip structure 51 so as to coat the chip surface and sidewall surfaces and bottom wall surface of TSV 47 and 49 openings. This is shown in FIG. 4. The layer 53 of insulating material may be any of an oxide, nitride, TEOS, PSG, and the like. The conformal layer is deposited so that the thickness of the insulating film along the trench sidewalls is sufficiently uniform. The coating may be carried out using a variety of known deposition techniques, such as, chemical vapor deposition (CVD) with CVD typically giving good conformality.

Figure 5:
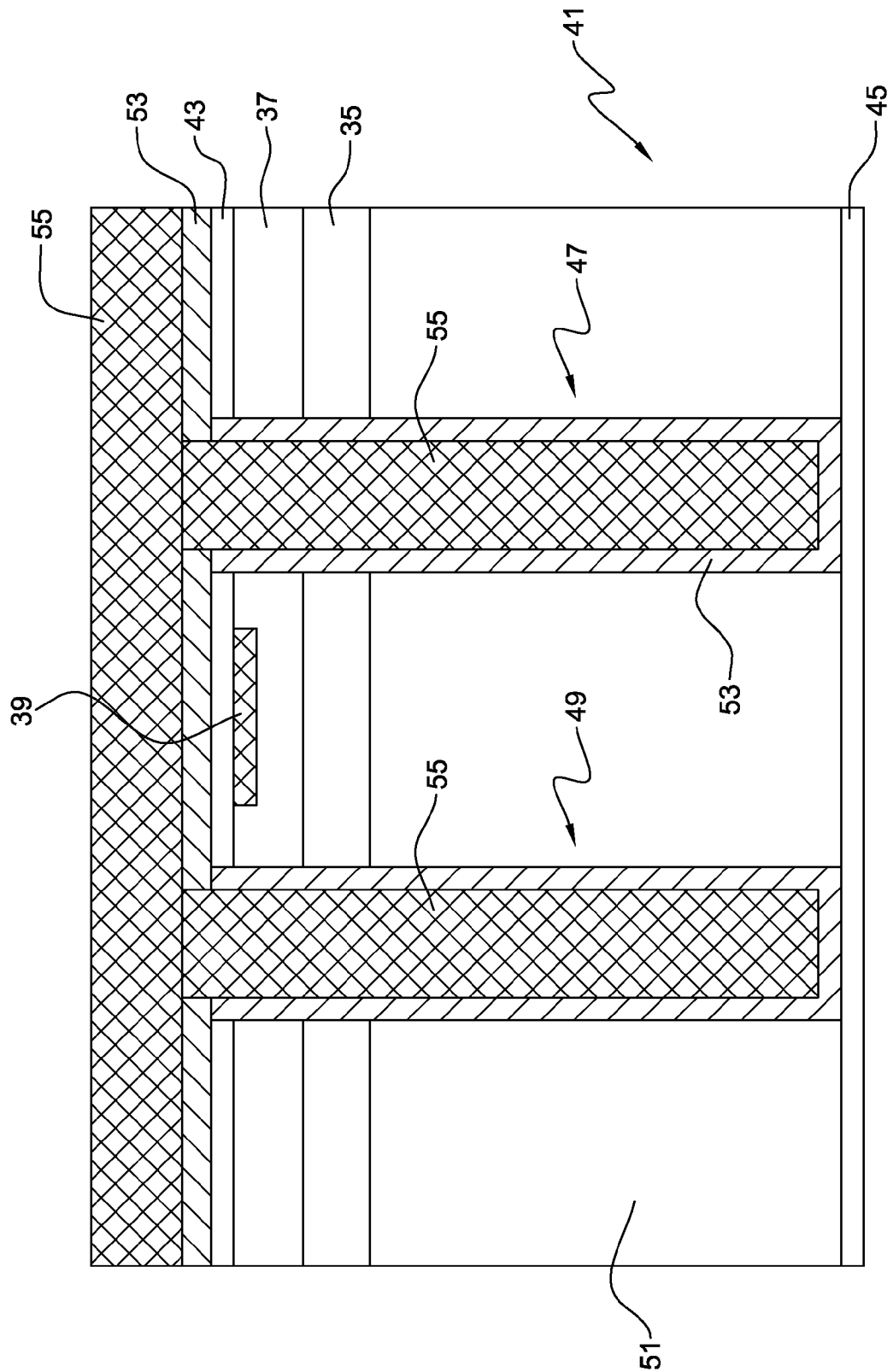
FIG. 5 shows the chip structure of FIG. 4 with metal deposition.

As shown in FIG. 5, after depositing conformal layer 53 of insulating material, a layer 55 of metal, such as, Al, Cu or Al doped with Cu, is deposited on chip structure 41 so as to fill the etched TSV 47 and 49 openings. The filling is carried out so as to not leave voids in the TSV openings. There are a variety of known deposition techniques for forming the metal on the chip structure so as to uniformly fill the vias, including CVD and electroplating, for example.

Figure 6:
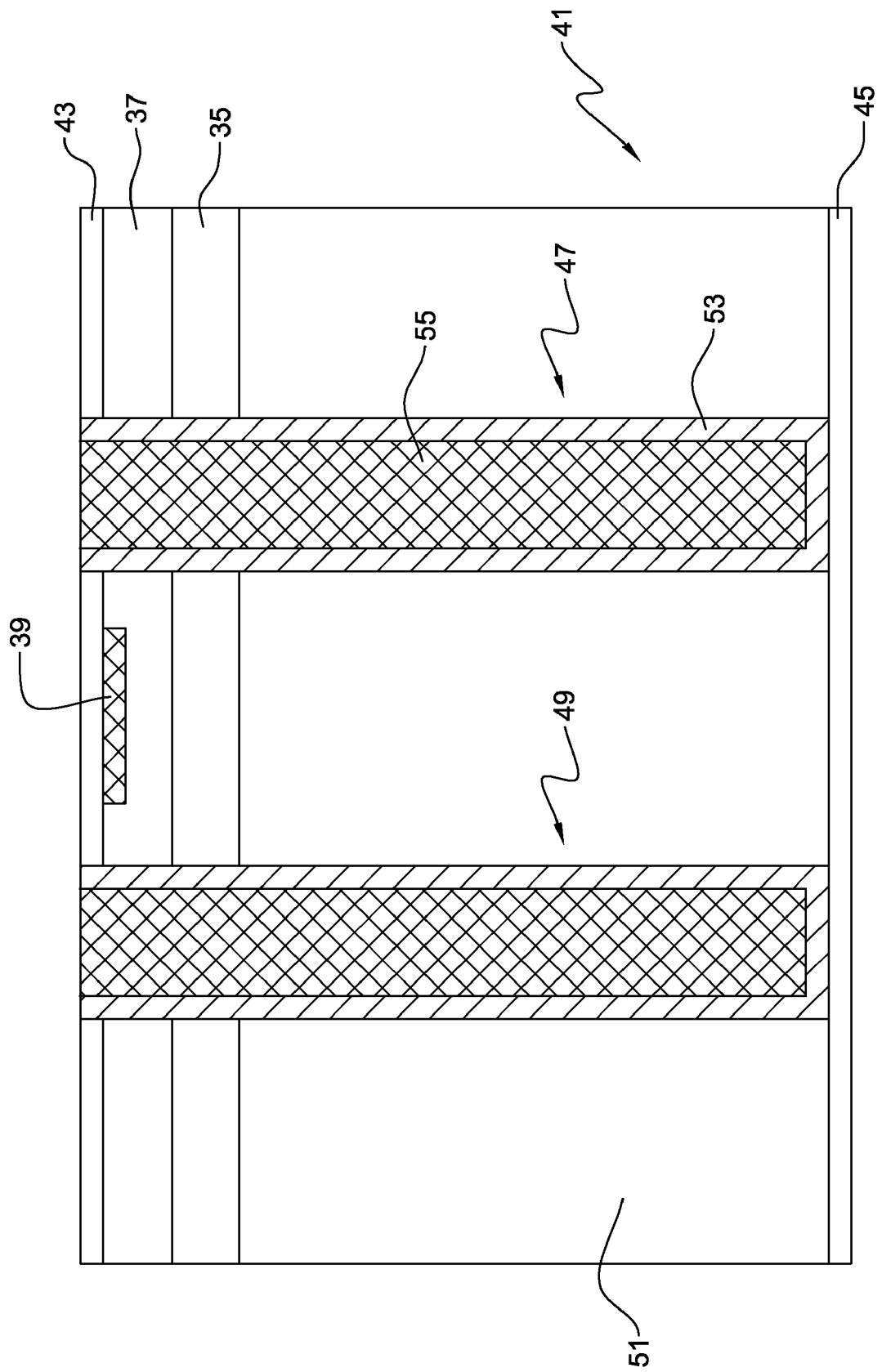
FIG. 6 shows the chip structure of FIG. 5 with the metal etched back to form TSVs.

After depositing layer 55 of metal on chip structure 41 so as to fill the TSV 47 and 49 openings, excessive metallic and insulating material may be removed from the top of chip structure 41 down to protective layer 43, as shown in FIG. 6. This may be done using a chemical-mechanical polishing (CMP) process which is stopped at the upper surface of protective layer 43, the latter of which acts as a CMP etch stop layer. Thus, both layer of metal 55 and layer of insulating material 53 are removed from the top surface of chip structure 41 leaving the metal filled TSVs 47 and 49 exposed.

Figure 7:
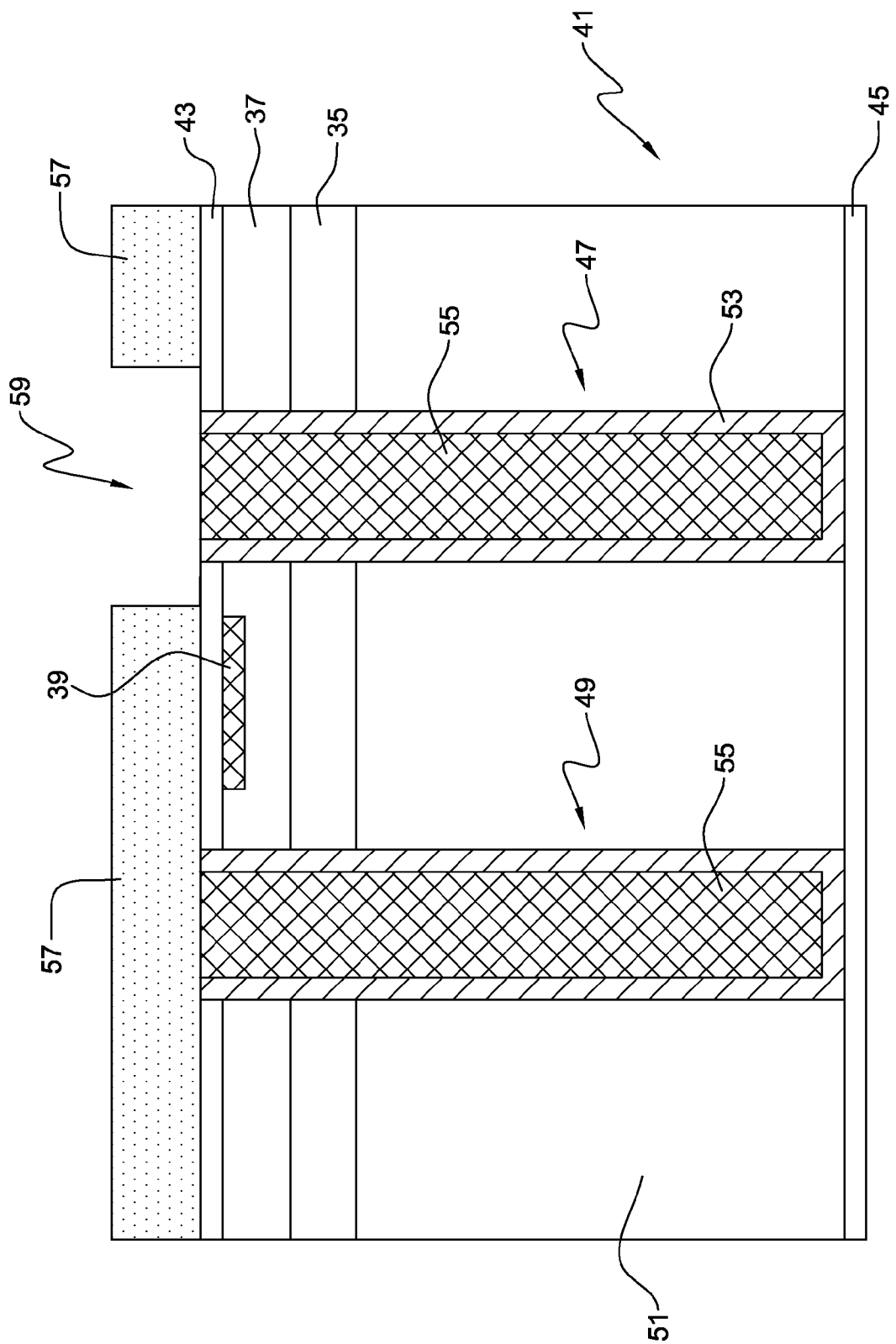
FIG. 7 shows the chip structure of FIG. 6 with a layer of photoresist.

As shown in FIG. 7, a layer of resist or contacting mask 57 is then formed on the top surface of chip structure 41. The mask may be a photo resist mask patterned to form an opening 59 over TSV 47. As shown, the opening extends beyond the width of filled TSV 47.

Figure 8:
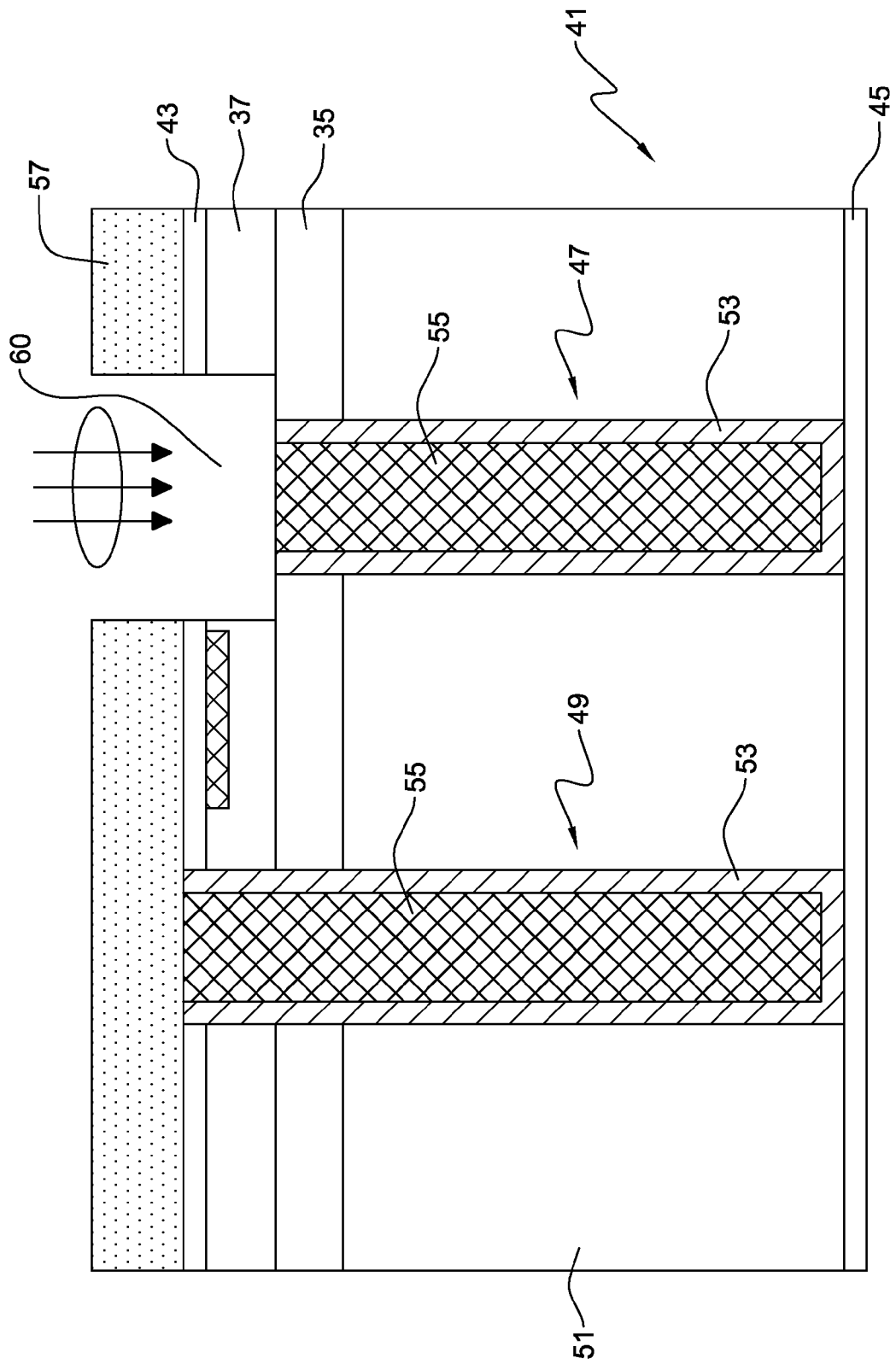
FIG. 8 shows the chip structure of FIG. 7 with a portion of a TSV etched back.

An RIE process may then be used to etch back layers 43, 37 and metal in metal filled TSV 47 to form recess 60, as shown in FIG. 8. Etching stops at FEOL layer 35. Thus, as shown, the etch process also removes the sidewall dielectric formed by the deposition of conformal layer 53 of insulating material and insulating material from BEOL layer 37, as well as material from protective layer 43. It should be noted, that the etch process may also be conducted in several steps, in-situ, without breaking vacuum. Since there are several different material layers to be removed, including metal, conformation layer, dielectrics, etc., each material layer may then be etched in a separate step. After etching, resist layer 57 is removed.

Figure 9:
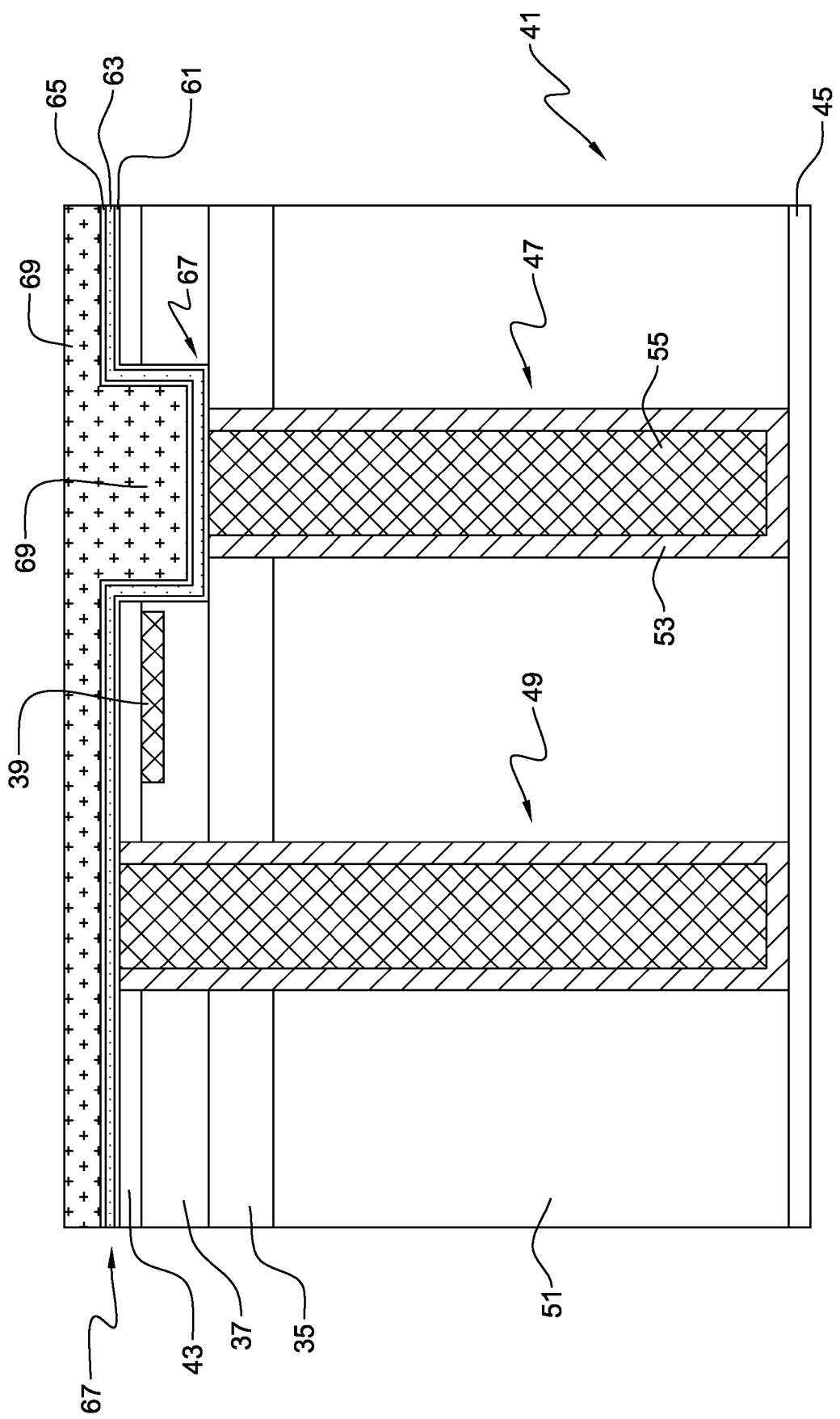
FIG. 9 shows the chip structure of FIG. 8 with metal/insulator/metal (MIM) and sacrificial filler layers formed thereon.
Figure 10:
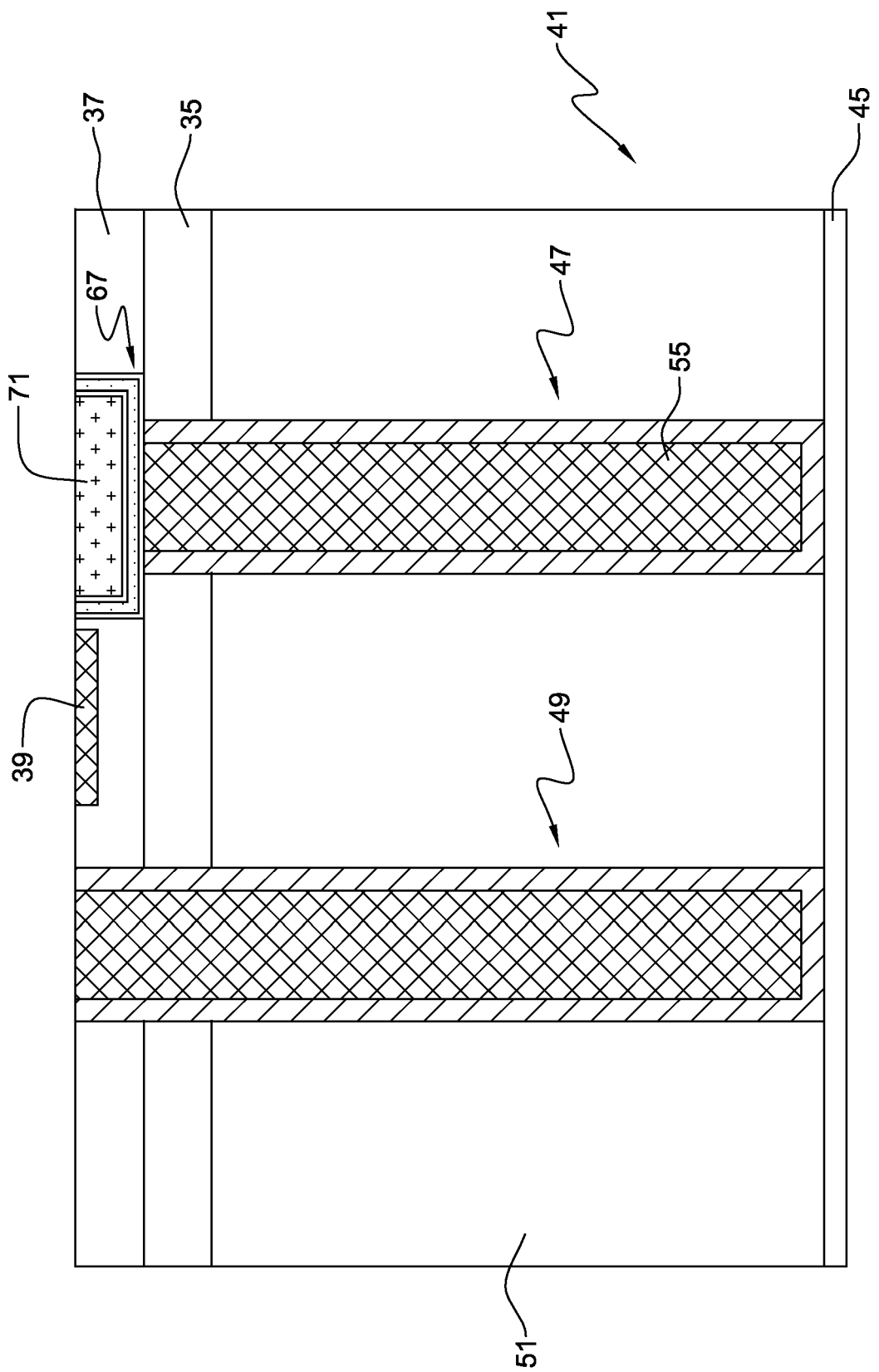
FIG. 10 shows the chip structure of FIG. 9 with surface MIM and excessive filler material removed.

FIGS. 9 and 10 show a process that may be used to form an anti-fuse structure, as shown in FIG. 1, for example. Any of a variety of known MIM layers may be used for this purpose. For example, an amorphous dielectric layer structure may be used for the layer of insulation in the MIM structure. Such structure may be formed, as shown in FIG. 9, by depositing a conformal layer 61 of approximately 50-100 Å of SiC:H. This may be followed by depositing a conformal layer 63 of approximately 1000-2000 Å of Si:H. Then, another conformal layer 65 of approximately 50-100 Å of SiC:H is deposited on layer 63 to thereby form an intrinsic amorphous dielectric layered structure 67. Such structure may be formed by known deposition techniques, such as, those used in a PECVD system, for example. It is clear that other known anti-fuse MIM structures using various insulating layers between metal layers may be used, as known to those skilled in the art. Similarly, structures other than MIM structures that act as programmable anti-fuse arrangements may be used.

After forming dielectric structure 67, a sacrificial filler layer 69 is deposited upon the dielectric structure and in the recess or opening 60 formed above STV 47. The filler layer material may be a polymer, polyimide, etc., and is used to protect the layered anti-fuse structure 67 in the opening formed above STV 47, during a subsequent CMP process that removes unnecessary material on the top surface of the chip structure. In this regard, the layered anti-fuse structure 67 is only necessary in the opening above TSV 47.

As shown in FIG. 10, sacrificial filler layer 69 is removed from the top of the chip structure except for the residual amount 71 of filler material 69 left in the recess above TSV 47. In addition, protective layer 43 is removed during this process. CMP processing may be used for this purpose with removal stopping at BEOL layer 37. The CMP process to BEOL layer 37 exposes conductive contact 39.

The residual filler material 71 is then removed by etching. A selective etch may be used for this process, such as, an O2 plasma ash etch. With the removal of residual filler material 71, the recess may be filled with a conductive material, such as, metal. Since the TSVs may be filled, for example, with any one of Al, Cu or W, then the metal selected here would typically be the same.

Figure 11:
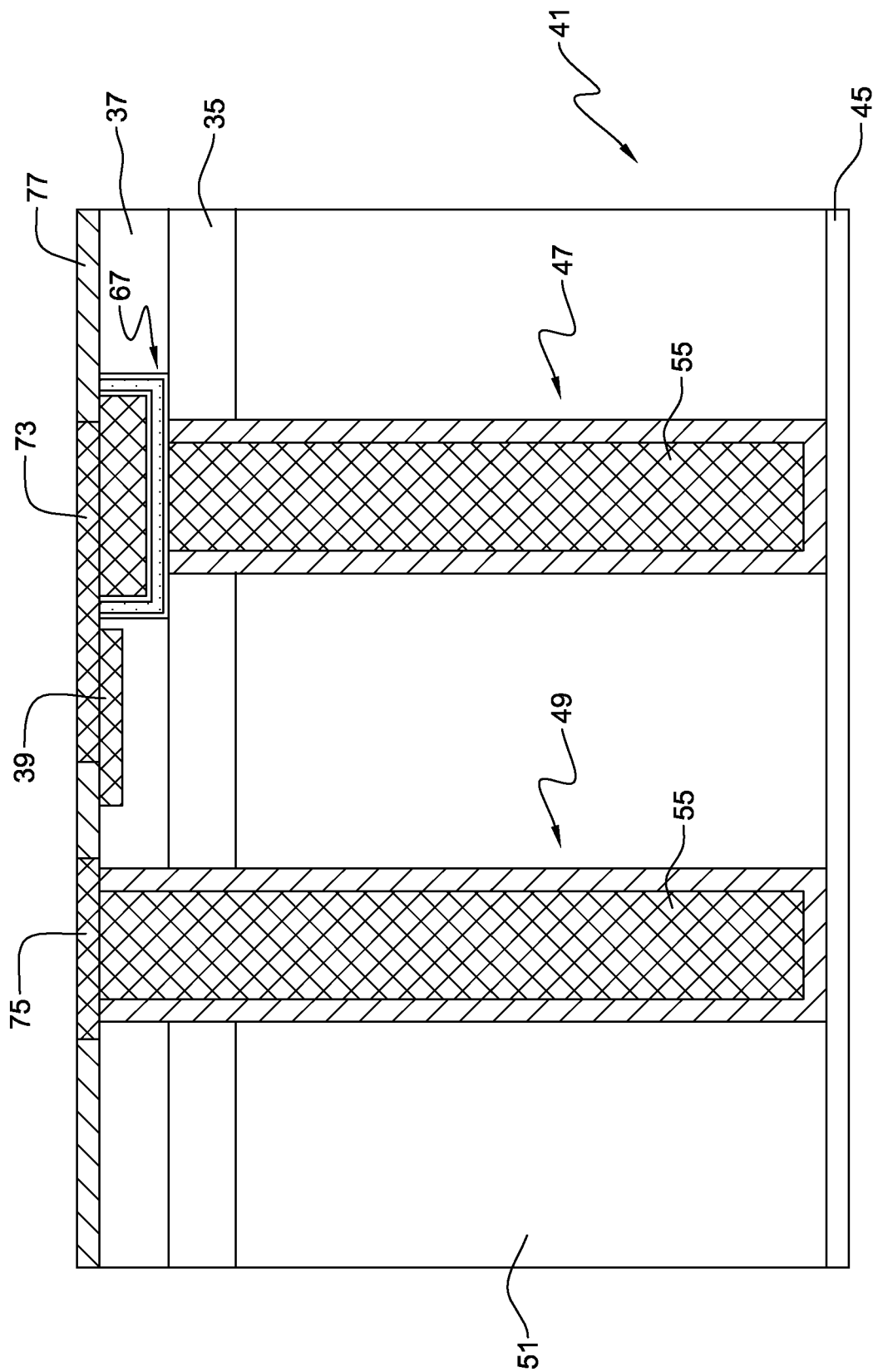
FIG. 11 shows the chip structure of FIG. 10 with metallization.

Thus, as shown in FIG. 11, the recess is filled with a metal to form contact 73 in the recess and extending over metal contact 39. As stated above, the metal used preferably corresponds to the same type of metal used in TSVs 47 and 49 and circuit contact 39. During this same process of forming contact 73, a metal contact 75 is made to TSV 49. A conventional damascene process may be used to form contacts 73 and 75 within openings in dielectric layer 77.

Figure 12:
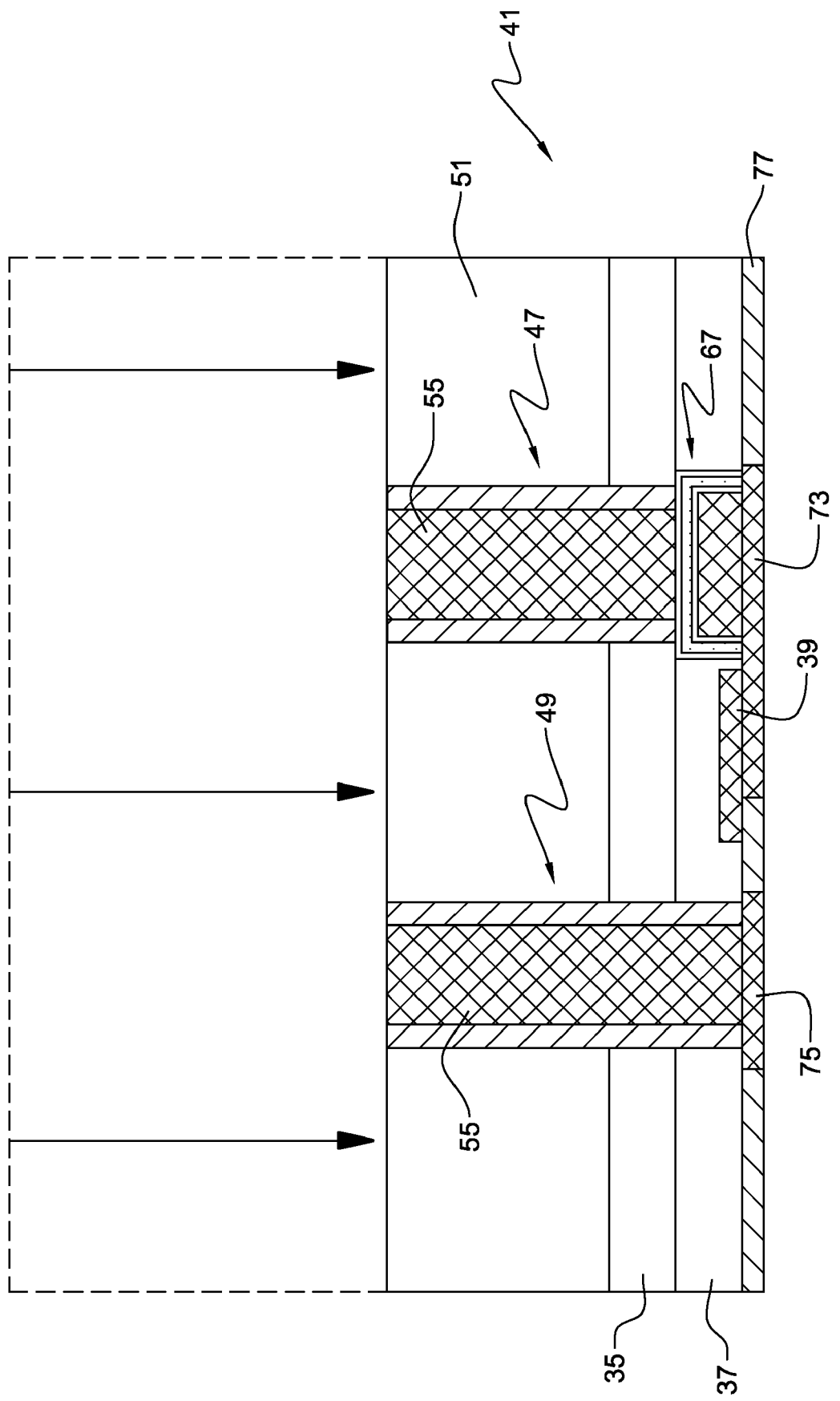
FIG. 12 shows the chip structure of FIG. 11 with wafer thinning from the backside.

As shown in FIG. 12, wafer thinning from the back side may then be carried out to thin chip structure 41. The TSVs shown in the previous Figures extend to protective layer 45 and, thus, where this is the case, thinning involves removal of protective layer 45 and insulating material 53 at the bottom of the TSVs to reveal metal 55 in the TSVs. Where the TSVs extend to less than the thickness of chip layer 51, additional silicon would necessarily be removed to expose the TSV. Typically, after thinning, the chip layer thickness would be in the 20µ to 200µ range. Silicon thinning may also be carried out earlier in the process described to form programmable TSVs. Silicon thinning may be carried out using, for example, backside grinding and/or TMA etch, as depicted by the arrows in FIG. 12.

Figure 13:
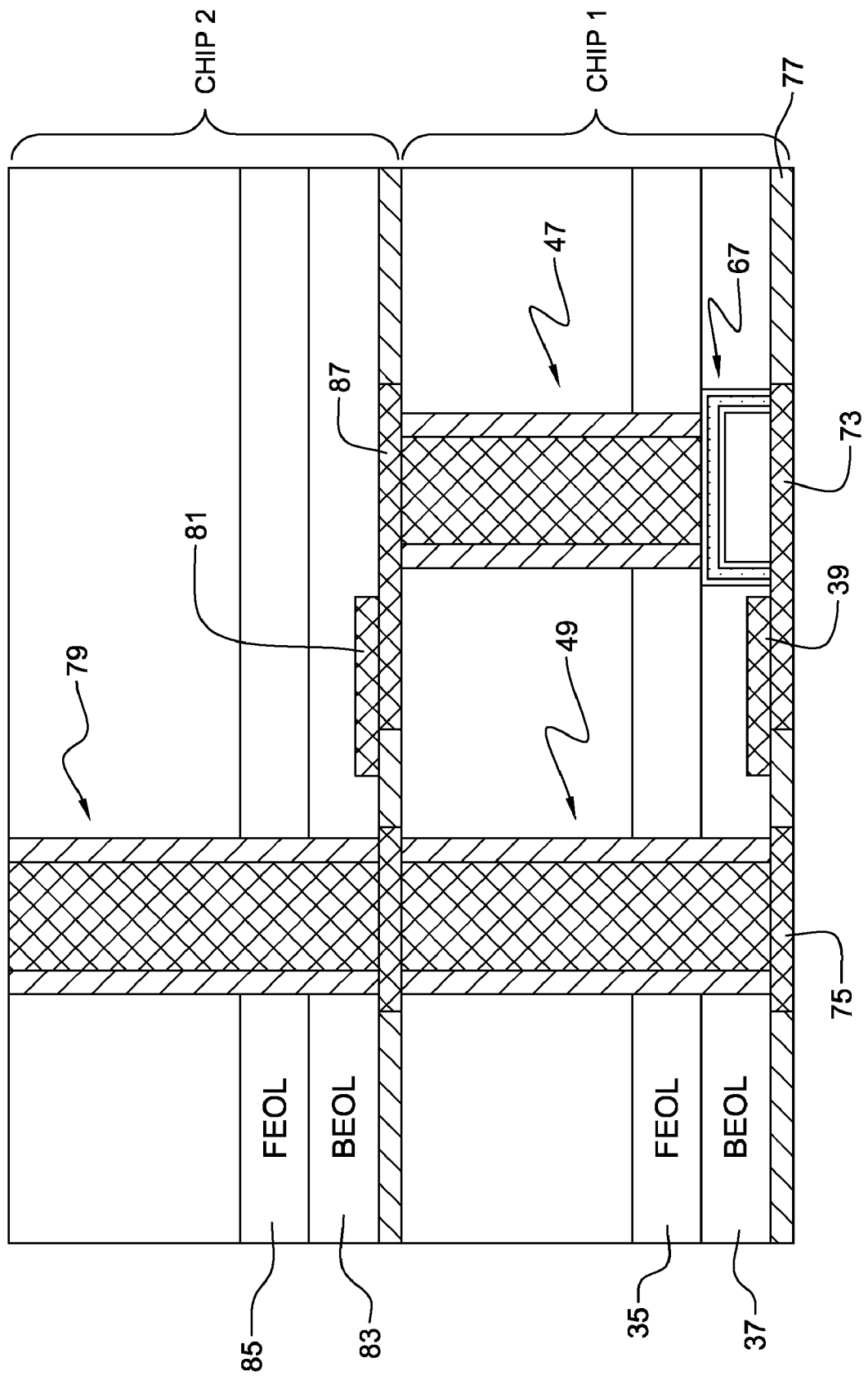
FIG. 13 shows a pair of chips stacked one on another.

After wafer thinning, the resulting chip with anti-fuse programmable TSV may be stacked on other chips, with such chips being with or without programmable TSVs. FIG. 13 shows two such stacked chips. Chip 1 includes anti-fuse programmable TSV 47 and standard, or non-programmable, TSV 49. Chip 2, stacked on chip 1, includes just one non-programmable TSV.

Chip 2 may be bonded to chip 1 using an adhesive-free approach wherein covalent bonding at room temperature is employed. Alternatively, bonding techniques utilizing adhesive, pressure and/or heat may also be used.

As shown in FIG. 13, metal contact 81 in BEOL layer 83 connects to programming control circuitry in FEOL layer 85. Metal contact 81 is also connected to metal contact 87, the latter of which may be formed by a damascene process, similar to that used in chip 1. As shown, metal contact 87 is bonded to programmable TSV 47. As pointed out earlier, metal contact 39 in chip 1 is connected to programming control circuitry in FEOL layer 35. Thus, programming control circuitry is connected to opposing ends of programmable TSV 47.

TSV 79 in chip 2 is stacked on TSV 49 in chip 1. Thus, a vertical non-programmable interconnect is made between the two chips. On the other hand, programmable TSV 47 makes a connection between the two chips only when programmed to do so. It is clear that other chips may be stacked on chips 1 and 2 with all of the stacked chips having different combinations of non-programmable and programmable TSVs in any number.

Figure 14A:
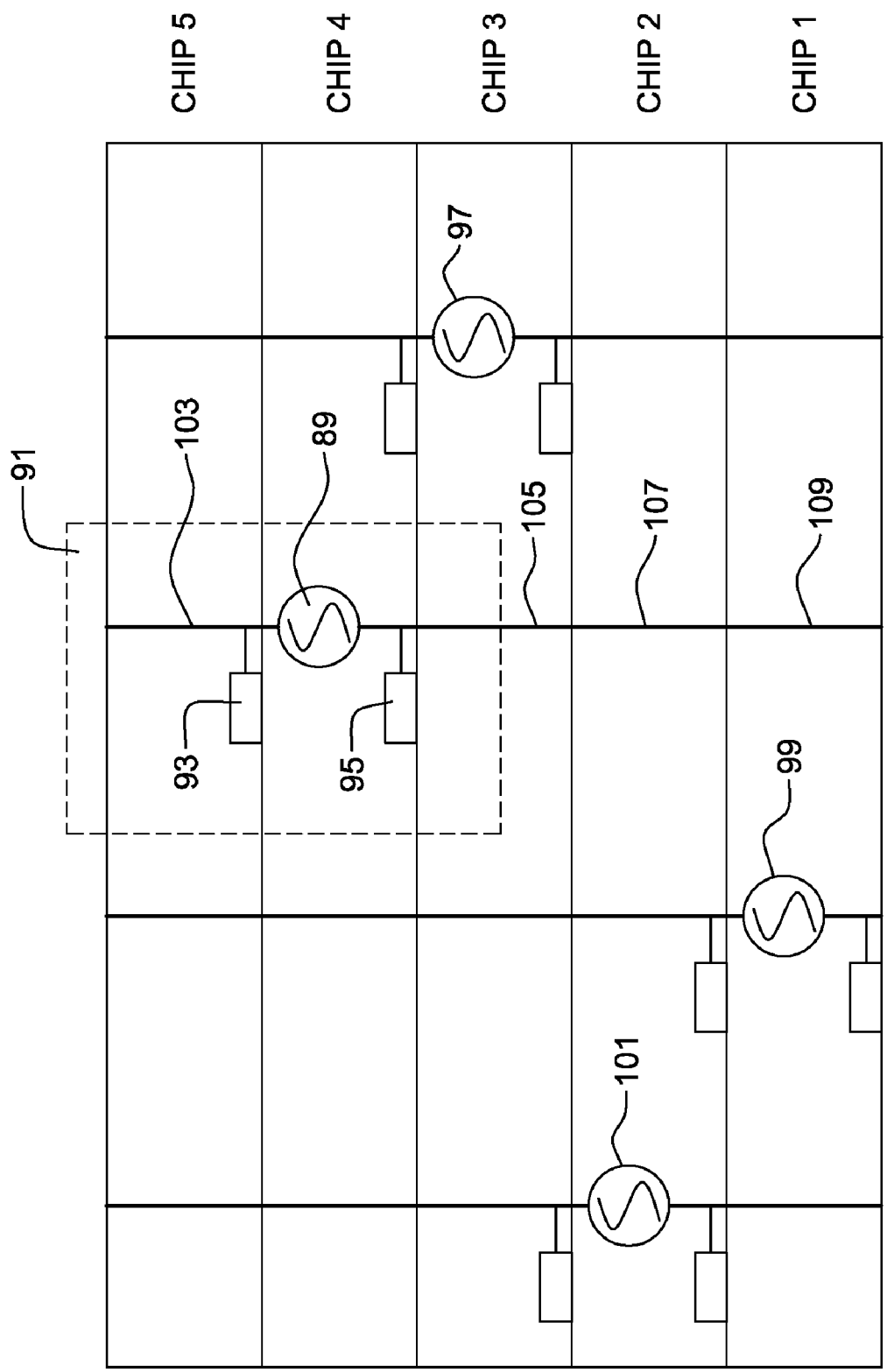
FIG. 14A shows a general view of a chip stack structure with each chip having a programmable TSV and non-programmable TSVs.

FIG. 14A shows a general view of a chip stack configuration with each chip having programmable and non-programmable TSVs. Although a stack of five chips is shown, this is for illustrative purposes only and, as above noted, any combination of chips with programmable and non-programmable TSVs is possible. As also noted above, the programming of a TSV is done across a pair of chips with complementary circuitry provided in each chip. Thus, as seen in FIG. 14A, programmable TSV 89 within dotted line block 91 has programming control circuitry 93 in chip 5 and programming control circuitry 95 in chip 4. Similar programming control circuitry schemes are shown for programmable TSVs 97, 99 and 101. It is clear that the TSVs 103, 105, 107 and 109 above and below programmable TSV 89 are conventional, non-programmable TSVs making a direct connection, as depicted in chips 1, 2 and 3.

Figure 14B:
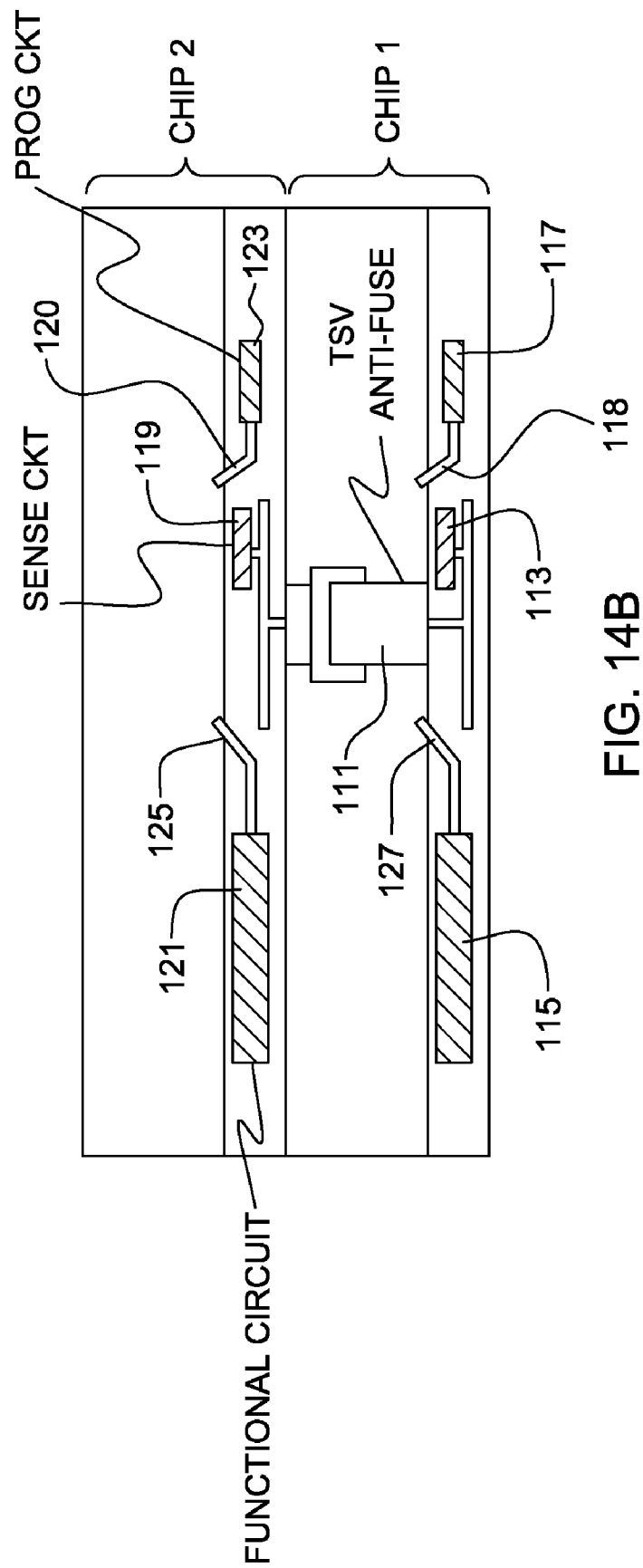
FIG. 14B shows a conceptual schematic of the circuitry on a pair of stacked chips that may be used to program the TSVs.

FIG. 14B shows a conceptual schematic of the circuitry arrangement on a pair of stacked chip. Chip 1 includes a programmable anti-fuse TSV 111, sense circuitry 113, functional circuits 115 and programming circuitry 117. Chip 2 includes sense circuitry 119, functional circuitry 121 and programming circuitry 123. Switches 125 and 127 act as isolation switches to isolate the functional circuitry from the programming and sensing circuitry. The programming and sensing circuitry from each chip acts together to program TSV 111. The programming circuitry 117 and 123 acts to cause current to pass through TSV 111 by closing switches 118 and 120 to thereby create a non-volatile conductive path from chip 1 to chip 2 and, thus, program TSV 111. The sensing circuitry acts to determine when TSV 111 is programmed and thus stop the current from flowing through TSV 111.

Figure 14C:
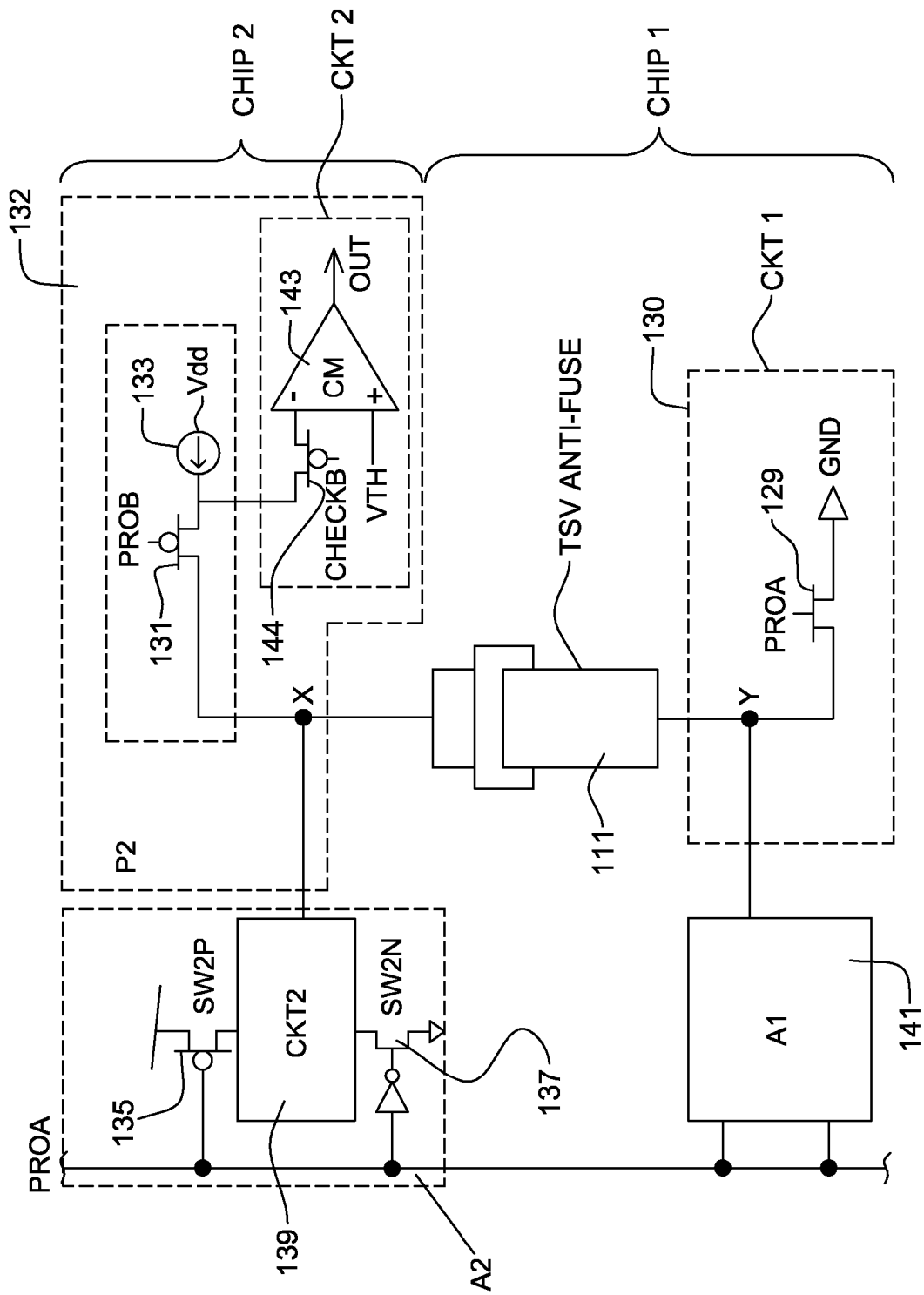
FIG. 14C shows a diagram of control circuitry on a pair of stacked chips that may be used to program the TSVs.
Figure 14D:
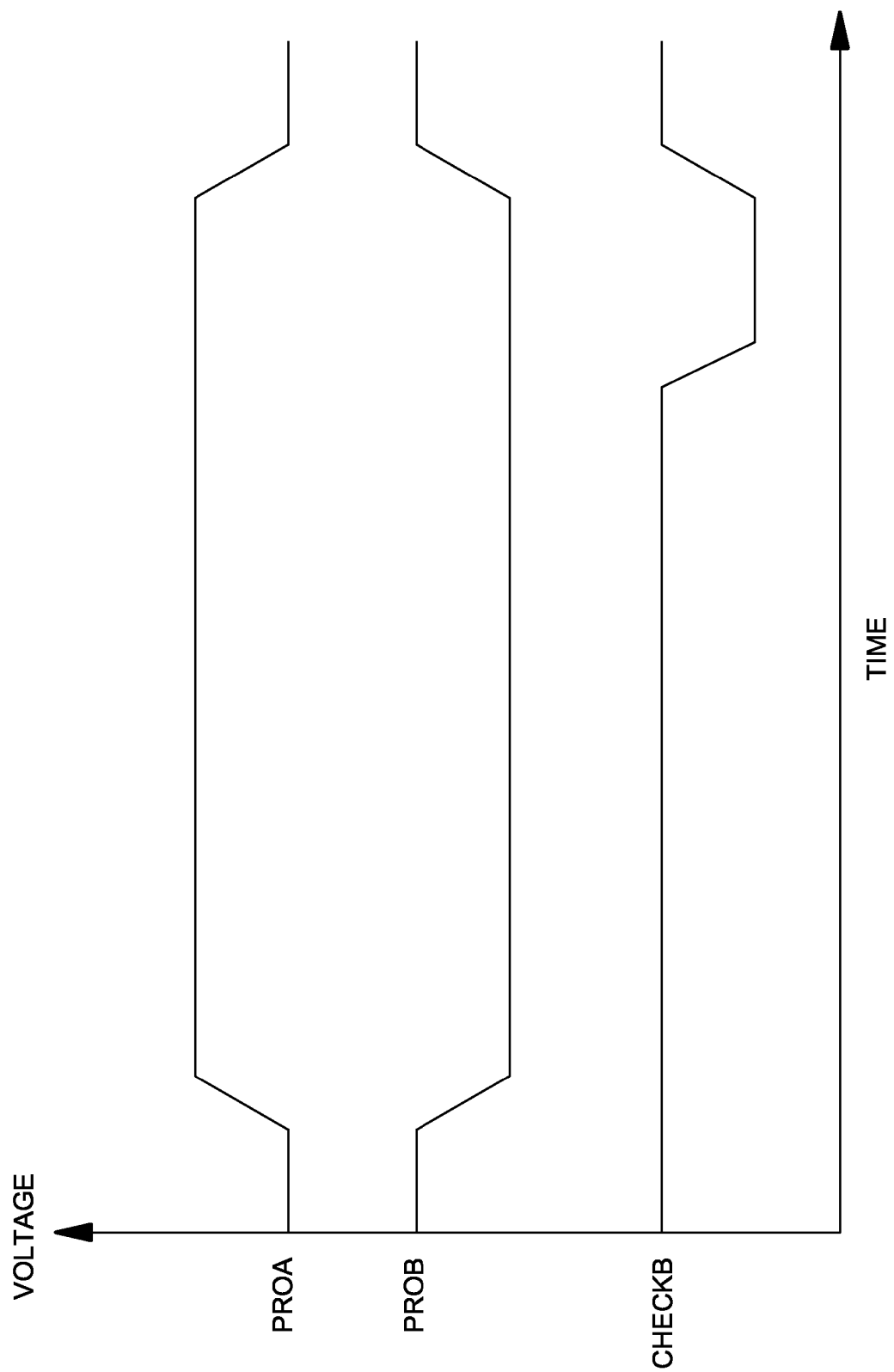
FIG. 14D shows a series of voltage wave forms used to control the operation of the control circuitry of FIG. 14C.

In FIG. 14C, there is shown a more detailed circuitry embodiment for carrying out the programming of a TSV across a pair of chips. TSV 111 in chip 1 is connected between the X node in chip 2 and Y node in chip 1. Complementary programming voltage signals, "PROA" and "PROB", as shown in FIG. 14D, are applied to respective complementary type switches 129 and 131 within programming blocks 130 and 132. Switch 129 may be an nMOSFET and switch 131 a pMOSFET. These voltages act to open the switches and enable current from current source 133 to pass through TSV 111 to ground.

At the same time, voltage signal "PROA" is applied to complementary p-type switch 135 and n-type switch 137 to isolate the chip 2 functional circuitry 139 from the programming circuitry in block 132. Similar circuitry provided in block 141 acts to isolate the functional circuitry in chip 1 from the programming circuitry in block 130.

When TSV anti-fuse structure 111 becomes conductive, the voltage level at node X drops and comparator 143 senses the drop, and provides an output signal of logic high when the voltage drops below Vth, wherein the Vth is a pre-defined threshold voltage. This operation is carried out by "CHECKB" voltage going to a logic low level pulse, as shown in FIG. 14D. This pulse is applied to p-type gate 144 to turn it on and connect the voltage level of node X to the negative input of comparator 143. If anti-fuse structure 111 has been programmed, its resistance is low (e.g. 10 ohms or less) and the voltage at node X is lower than Vth at comparator 143 positive input thereby producing a comparator output signal of logic high indicating the anti-fuse structure has been programmed successfully. This signal acts to cause the "PROA" signal to go low and "PROB" signal to go high and thus stop the programming operation.

It is noted that TSV 111 becomes conductive when the metal in the MIM structure of TSV 111 diffuses through the intermediate dielectric structure making the opposing metal layers short to one another. This is a result of a sufficiently high field being applied across the structure. Thus, the complementary circuits in chips 1 and 2 act to apply a field across TSV 111 sufficiently high to breakdown the TSV dielectric and cause current to flow to ground.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of programming a programmable through silicon via interconnecting chips in a chip stack:
    applying a first potential from chip voltage level circuitry of one chip in said chip stack to one end of said programmable through silicon via;
    apply a second potential different than said first potential from chip voltage level circuitry of another chip in said chip stack to another end of said programmable through silicon via;
    sensing when said programmable through silicon via is programmed using sensing circuits in each of said one chip and said another chip; and
    removing said first potential and said second potential from said programmable through silicon via when said via is programmed.

2. The method of claim 1, including the further step of isolating functional circuits in said one chip and said another chip from said steps of applying first potential and second potential during programming of said programmable through silicon via.

3. An electronic package, comprising:
    at least one chip having at least one programmable non-volatile metal/insulator/metal anti-fuse layered structure formed in a through silicon via for chip interconnection to other chips in a stacked chip structure;

control circuitry in at least two chips stacked one on another for programming said metal/insulator/metal anti-fuse layered structure from a high impedance state to a low impedance state by controlling the voltage level across opposing metal sides of said anti-fuse layered structure wherein said control circuitry in one of said at least two chips controls the voltage level applied to one of said metal sides of said anti-fuse layered structure and senses when said anti-fuse layered structure goes from said high impedance state to said low impedance state and wherein said control circuitry in the other of said at least two chips controls the voltage level on the other of said metal sides of said anti-fuse layered structure; and isolation circuits for decoupling said control circuitry from functional circuits in each of said at least two chips during programming operation.

4. An electronic package, comprising:

a plurality of stacked chips interconnected by through silicon vias at least some of which vias are programmable by non-volatile anti-fuse structure that provide a high impedance value in an unprogrammed state and a low impedance value in a programmed state in response to bias voltage applied through programming control circuitry arranged across adjacent chips and wherein said programmable vias have opposing electrical contacts, said programming control circuitry connecting one of said contacts to one side of a supply source through control circuitry in one chip and connecting the other of said contacts to the other side of said supply source through control circuitry in an adjacent chip;

isolation circuitry for isolating functional circuits in said chips from programming control circuitry during programming control operations; and sensing circuitry in said control circuitry in said one chip to sense when said non-volatile structure is programmed into said low impedance state and thereby initiate the disconnection of said supply source to said opposing electrical contacts in said one chip and said adjacent chip.

5. An electronic package comprising:

a chip stack having a plurality of chips stacked one on another with at least one chip having a programmable through chip via programmable from one impedance state to another impedance state; and control circuitry formed in the chip circuitry of said at least one chip coupled to one end of said programmable through chip via to apply a chip voltage level to said one end of said programmable through chip via; and control circuitry formed in the chip circuitry of another chip coupled to another end of said programmable through chip via to apply a different chip voltage level to said another end of said programmable through chip via.

6. An electronic package, comprising:

a plurality of chips arranged in a stack with said chips interconnected by through chip vias with at least one of said vias of at least one chip including a programmable via responsive to chip voltage levels applied to opposing via contacts of said programmable via to change the impedance states of said programmable via;

control circuitry formed in the chip circuitry of said at least one chip and arranged to apply a chip voltage level to one of said opposing via contacts of said programmable via;

control circuitry formed in the chip circuitry of another chip of said plurality of chips and arranged to apply a chip voltage level to said other of said opposing via contacts of said programmable via; and isolation circuitry formed in said at least one chip and said another chip responsive to chip voltage levels to isolate functional circuitry formed in said at least one chip and said another chip from the control circuitry formed in said at least one chip and said another chip.

7. The electronic package of claim 6 wherein said voltage levels applied to said one of said opposing contacts and said other opposing via contacts is complementary.

8. The electronic package of claim 6 including sensing circuitry formed in the circuitry of at least one of said one chip or said another chip and arranged to sense when said programmable via changes states.

* * * * *